US012710317B2

(12) United States Patent
Patel et al.

(10) Patent No.: US 12,710,317 B2
(45) Date of Patent: Aug. 18, 2026

(54) SENSING ARRANGEMENTS FOR CAMERA MODULES

(71) Applicant: Apple Inc., Cupertino, CA (US)

(72) Inventors: Himesh Patel, Fremont, CA (US); Anish Bhide, San Francisco, CA (US); Shahrooz Shahparnia, Monte Sereno, CA (US)

(73) Assignee: Apple Inc., Cupertino, CA (US)

( * ) Notice: Subject to any disclaimer, the term of this patent is extended or adjusted under 35 U.S.C. 154(b) by 398 days.

(21) Appl. No.: 18/373,839

(22) Filed: Sep. 27, 2023

(65) Prior Publication Data

US 2025/0102367 A1 Mar. 27, 2025

(51) Int. Cl.
*G01K 1/02* (2021.01)
*G01K 1/14* (2021.01)
(Continued)

(52) U.S. Cl.
CPC ............... *G01K 1/026* (2013.01); *G01K 1/14* (2013.01); *G01K 7/20* (2013.01); *G01R 33/07* (2013.01);
(Continued)

(58) Field of Classification Search
CPC ............ G01K 1/026; G01K 1/14; G01K 7/20; G01K 2215/00; G01K 1/02; G01R 33/07;
(Continued)

(56) References Cited

U.S. PATENT DOCUMENTS 7,860,667 B2 * 12/2010 Vogel ....................... G01F 1/696 73/204.22
8,996,327 B2 * 3/2015 Ge ........................... G01K 1/20 374/166
(Continued)

FOREIGN PATENT DOCUMENTS

CN 107014514 A * 8/2017 ............... G01K 7/24
CN 112729582 B * 12/2021 ............... G01K 7/02
(Continued)

OTHER PUBLICATIONS

Ametherm Circuit Protection Thermistors, "NTC Thermistors—Temperature Measurement with a Wheatstone Bridge," www.ametherm.com.thermistor/nic-thermistors-temperature-measurement-with-wheatstone-bridge, known at least as early as Sep. 27, 2023, 8 pages.

*Primary Examiner* — Laura Martin
*Assistant Examiner* — Julia Fitzpatrick
(74) *Attorney, Agent, or Firm* — Brownstein Hyatt Faber Schreck, LLP

(57) ABSTRACT

Described herein are sensing arrangements for a camera module that include a position sensor, a temperature sensor, a driver chip, and a multiplexer. The position sensor has a first bias input and a first set of terminals. The temperature sensor has a temperature-sensitive resistor, a second bias input, and a second set of terminals. The driver chip includes a bias output connected to a bias current source and a set of inputs for receiving a voltage signal. The multiplexer is configured to selectively connect the position sensor or the
(Continued)

temperature sensor to the driver chip, such that, the bias output is connected to the first or the second bias input, respectively, and the set of inputs is connected to the first or the second set of terminals, respectively, thereby causing the voltage signal received by the set of inputs to indicate a position or a temperature of the camera module, respectively.

20 Claims, 8 Drawing Sheets

(51) Int. Cl.
*G01K 7/20* (2006.01)
*G01R 33/07* (2006.01)
*G01R 33/09* (2006.01)
*H04N 23/51* (2023.01)

(52) U.S. Cl.
CPC ......... *G01R 33/093* (2013.01); *G01R 33/096* (2013.01); *G01R 33/098* (2013.01); *G01K 2215/00* (2013.01); *H04N 23/51* (2023.01)

(58) Field of Classification Search
CPC .. G01R 33/093; G01R 33/096; G01R 33/098; G01R 33/09; H04N 23/51
See application file for complete search history.

(56) References Cited

U.S. PATENT DOCUMENTS

| | | | | |
|---|---|---|---|---|
| 9,939,315 | B2 * | 4/2018 | Zusman | G01H 11/08 |
| 11,067,767 | B2 | 7/2021 | Maede et al. | |
| 11,178,331 | B2 | 11/2021 | Kim et al. | |
| 11,768,259 | B1 * | 9/2023 | Rubinsztain | H03F 3/38 324/251 |
| 2007/0019707 | A1 * | 1/2007 | Gozloo | G01K 1/026 374/E1.005 |
| 2018/0073933 | A1 * | 3/2018 | Keskin | G01K 1/14 |
| 2020/0149970 | A1 * | 5/2020 | Joyce | G01J 5/12 |
| 2022/0210296 | A1 | 6/2022 | Bang et al. | |

FOREIGN PATENT DOCUMENTS

| | | | | |
|---|---|---|---|---|
| DE | 102005049804 | A1 * | 5/2006 | H05B 1/023 |
| EP | 2267417 | A1 * | 12/2010 | G01F 1/6965 |
| EP | 2924404 | A1 * | 9/2015 | G01K 7/026 |
| ES | 2767680 | T3 * | 6/2020 | F01N 11/002 |
| FR | 3128052 | A1 * | 4/2023 | H02P 29/60 |
| KR | 101338756 | B1 * | 12/2013 | |
| KR | 20220133546 | | 10/2022 | |

* cited by examiner

SENSING ARRANGEMENTS FOR CAMERA MODULES

FIELD

The described embodiments relate generally to camera modules that may be used in electronic devices. More particularly, the present embodiments relate to sensing arrangements for a camera module that may measure signals from both position sensors and temperature sensors.

BACKGROUND

Cameras continue to be an important feature of consumer electronics devices such as smartphones, tablets, and computers. Some cameras include moveable optical components to provide additional functionality. For example, a camera may be configured to move an image sensor and/or a lens module within a camera. Some cameras may incorporate an autofocus (AF) mechanism that generates relative movement between a lens module and an image sensor along an optical axis of the camera. This relative movement adjusts an object focal distance in order to focus an object in front of the camera at an image plane to be captured by the image sensor of the camera. Similarly, some cameras may incorporate an optical images stabilization mechanism that compensates for external disturbances by generating lateral relative movement between a lens module and an image sensor. In order to provide for precise control over such mechanisms, it may be desirable to understand the relative position of the moving component (or components) within a camera, as well as the temperature at one or more locations within the camera. Accordingly, the camera may utilize this position and temperature information when controlling movement of an optical component.

SUMMARY

Described herein are sensing arrangements that are configured to measure signals from one or more position sensors and temperature sensors for respective position sensing and temperature sensing operations. Certain embodiments of this disclosure are directed to a sensing arrangement having a position sensor, a temperature sensor, a driver chip, and a multiplexer. The position sensor has a first bias input and a first set of terminals. The temperature sensor has a temperature-sensitive resistor, a second bias input, and a second set of terminals. The driver chip is communicably connected to the position sensor and the temperature sensor. The driver chip has a bias output connected to a bias current source and a set of inputs for receiving a voltage signal. The multiplexer is configured to selectively connect the position sensor or the temperature sensor to the driver chip. In response to the driver chip applying a first control signal to the multiplexer indicating a selection of the position sensor, the bias output is connected to the first bias input, and the set of inputs is connected to the first set of terminals, such that the voltage signal received by the set of inputs is indicative of a position measured by the position sensor. Further, in response to the driver chip applying a second control signal to the multiplexer indicating a selection of the temperature sensor, the bias output is connected to the second bias input, and the set of inputs is connected to the second set of terminals, such that the voltage signal received by the set of inputs is indicative of a temperature measured by the temperature sensor.

Other embodiments of this disclosure are directed to a driver for a camera module having one or more temperature sensors, a driver chip, and a multiplexer. Each temperature sensor has a respective temperature-sensitive resistor, a first temperature-sensing terminal, and a second temperature-sensing terminal. The driver chip is communicably connected to each of the one or more temperature sensors. The driver chip includes a first bias output connected to a first bias current source, a second bias output connected to a second bias current source, and a set of inputs for receiving a voltage signal. The multiplexer is configured to selectively connect a selected temperature sensor of the one or more temperature sensors to the driver chip. In response to the driver chip applying a control signal to the multiplexer indicating the selected temperature sensor, the first bias output and a first input of the set of inputs are connected to the first temperature-sensing terminal of the selected temperature sensor, and the second bias output and a second input of the set of inputs are connected to the second temperature-sensing terminal of the selected temperature sensor, such that the voltage signal received by the set of inputs is indicative of a temperature measured by the selected temperature sensor.

Still other embodiments are directed to a driver for a camera module having a position sensor, a temperature sensor, a driver chip, and a multiplexer. The position sensor has a first set of terminals and a first bias input. The temperature sensor has a second set of terminals, a second bias input, and a third bias input. The driver chip is communicably connected to the position sensor and the temperature sensor. The driver chip has a first bias output from a first bias current source, a second bias output from a second bias current source, and a set of inputs for receiving a voltage signal. The multiplexer is configured to selectively connect the position sensor or the temperature sensor to the driver chip. In response to the driver chip applying a first control signal to the multiplexer indicating a selection of the position sensor, the first bias output or the second bias output is connected to the first bias input, and the set of inputs are connected to the first set of terminals, such that the voltage signal received by the set of inputs is indicative of a position measured by the position sensor. In response to the driver chip applying a second control signal to the multiplexer indicating a selection of the temperature sensor, the first bias output is connected to the second bias input, the second bias output is connected to the third bias input, and the set of inputs are connected to the second set of terminals, such that the voltage signal received by the set of inputs is indicative of a temperature measured by the temperature sensor.

In addition to the example aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
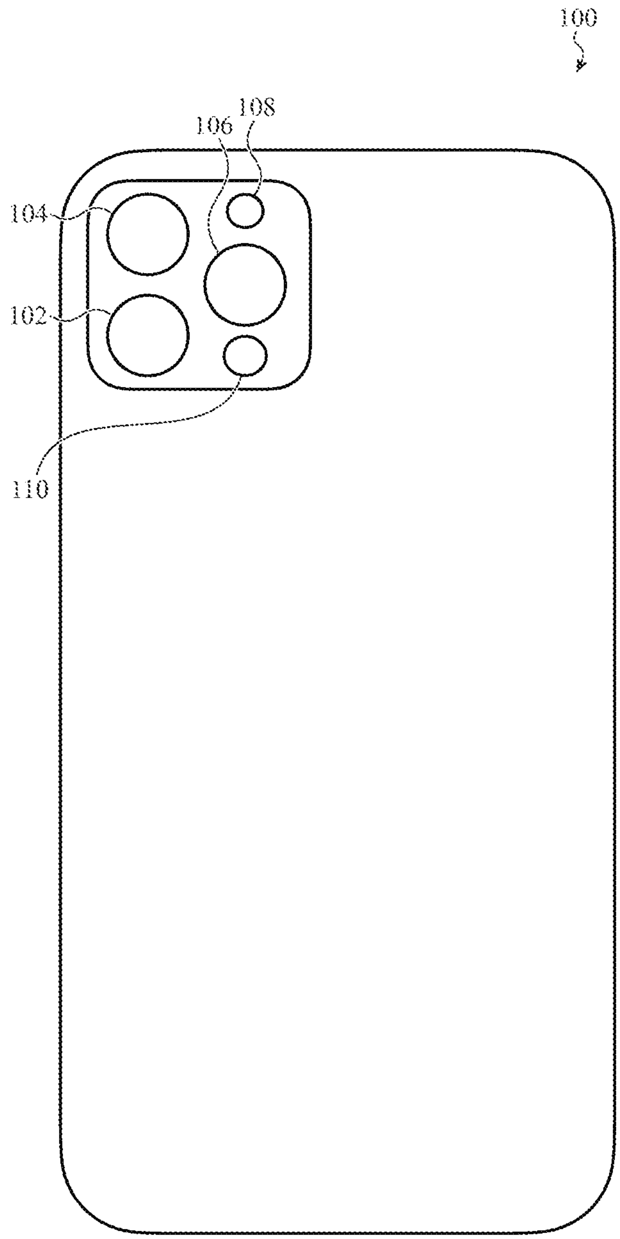
FIG. 1A illustrates a device as described herein having a camera module with a driver, such as described herein.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Directional terminology, such as "top," "bottom," "upper," "lower," "front," "back," "over," "under," "above," "below," "left," "right," "vertical," "horizontal," etc. is used with reference to the orientation of some of the components in some of the figures described below, and is not intended to be limiting. Because components in various embodiments can be positioned in a number of different orientations, directional terminology is used for purposes of illustration to demonstrate the relative orientation between components of the systems and devices described herein. The directional terminology is intended to be construed broadly, and therefore should not be interpreted to preclude components being oriented in different ways. As used herein, two components are "communicably connected" if, during operation of the sensing arrangements described herein, they are electrically connected in a manner that allows for current to travel between the two components. Communicably connected components may be continuously electrically connected or may be intermittently electrically connected. For example, a sensing arrangement as may include one or more multiplexers, switches, or other intervening components that may selectively control when two communicably connected components are electrically connected.

Embodiments of the disclosure are directed to camera modules in electronic devices (e.g., smartphones, tablet computers, etc.) that include a sensing arrangement having a multi-purpose driver. The multi-purpose driver may include a driver chip (e.g., an integrated circuit) that is communicably connected to one or more position sensors and temperature sensors, thereby allowing the driver chip to measure signals from these sensors. The position sensors and/or temperature sensors may be switchably connected to a common set of input terminals of the driver chip, such that the same circuitry (e.g., an analog front end (AFE) circuitry and an analog-to-digital converter (ADC)) may be used to process signals from multiple sensors. In this way, the same set of input terminals of the driver chip may be used to measure voltage signals that represent either position (when received from a position sensor) or temperature (when received from a temperature sensor). Such a solution advantageously may reduce the size of driver chip and/or the number of driver chips needed to measure signals from a set of position and temperature sensors. The measured signals may be used as feedback for operation of the camera module, such as part of an autofocus or optical image stabilization operation.

These foregoing and other embodiments are discussed below with reference FIGS. 1A-7. However, those skilled in the art will readily appreciate that the detailed description given herein with respect to these Figures is for explanatory purposes only and should not be construed as limiting.

FIG. 1A depicts an example device 100 as described herein. As shown there, the device 100 includes a multi-camera system. For example, in the variation shown in FIG. 1A, the device 100 includes a first camera 102, a second camera 104, and a third camera 106. One or more of the first camera 102, the second camera 104, and the third camera 106 may include a sensing arrangement, such as described herein. It should be appreciated that the device 100 may include a single camera, or a multi-camera system having any number of cameras (with any relative positioning) as may be desired. Additionally, while shown as placed on the rear of a device 100, it should be appreciated that a camera having a sensing arrangement, such as described herein, may be additionally or alternatively placed on the front (e.g., a front side having a display) or any other side of the device as desired.

In some embodiments, the device 100 may include a flash module 108. The flash module 108 may provide illumination to some or all of the fields of view of the cameras of the device (e.g., the fields of view of the first camera 102, the second camera 104, and/or the third camera 106). This may assist with image capture operations in low light settings. Additionally, or alternatively, the device 100 may further include a depth sensor 110 that may calculate depth information for a portion of the environment around the device 100. Specifically, the depth sensor 110 may calculate depth information within a field of coverage (i.e., the widest lateral extent to which the depth sensor is capable of providing depth information). The field of coverage of the depth sensor 110 may at least partially overlap the field of view of one or more of the cameras (e.g., the fields of view of the first camera 102, second camera 104, and/or third camera 106). The depth sensor 110 may be any suitable system that is capable of calculating the distance between the depth sensor 110 and various points in the environment around the device 100.

The depth information may be calculated in any suitable manner. In one non-limiting example, a depth sensor may utilize stereo imaging, in which two images are taken from various positions, and the distance (disparity) between corresponding pixels in the two images may be used to calculate depth information. In another example, a depth sensor may utilize structured light imaging, whereby the depth sensor may image a scene while projecting a known pattern (typically using infrared illumination) toward the scene, and then may look at how the pattern is distorted by the scene to calculate depth information. In still another example, a depth sensor may utilize time of flight sensing, which calculates depth based on the amount of time it takes for light (typically infrared) emitted from the depth sensor to return from the scene. A time-of-flight depth sensor may utilize direct time of flight or indirect time of flight, and may illuminate an entire field of coverage at one time, or may only illuminate a subset of the field of coverage at a given time (e.g., via one or more spots, stripes, or other patterns that may either be fixed or may be scanned across the field of coverage). In embodiments where a depth sensor utilizes infrared illumination, this infrared illumination may be utilized in a range of ambient conditions without being perceived by a user.

In some embodiments, the device 100 is a portable multifunction electronic device, such as a mobile telephone, that also contains other functions, such as PDA and/or music player functions. Exemplary embodiments of portable multifunction devices include, without limitation, the iPhone®, iPod Touch®, and iPad® devices from Apple Inc. of Cupertino, California. Other portable electronic devices, such as laptops or tablet computers with touch-sensitive surfaces (e.g., touch screen displays and/or touchpads), are, optionally, used. It should also be understood that, in some embodiments, the device is not a portable communications device, but is a desktop computer, which may have a touch-sensitive surface (e.g., a touch screen display and/or a touchpad). In some embodiments, the electronic device is a computer system that is in communication (e.g., via wireless communication, via wired communication) with a display generation component. The display generation component is configured to provide visual output, such as display via a CRT display, display via an LED display, or display via image projection. In some embodiments, the display generation component is integrated with the computer system. In some embodiments, the display generation component is separate from the computer system. As used herein, "displaying" content includes causing to display the content by transmitting, via a wired or wireless connection, data (e.g., image data or video data) to an integrated or external display generation component to visually produce the content.

Figure 1B:
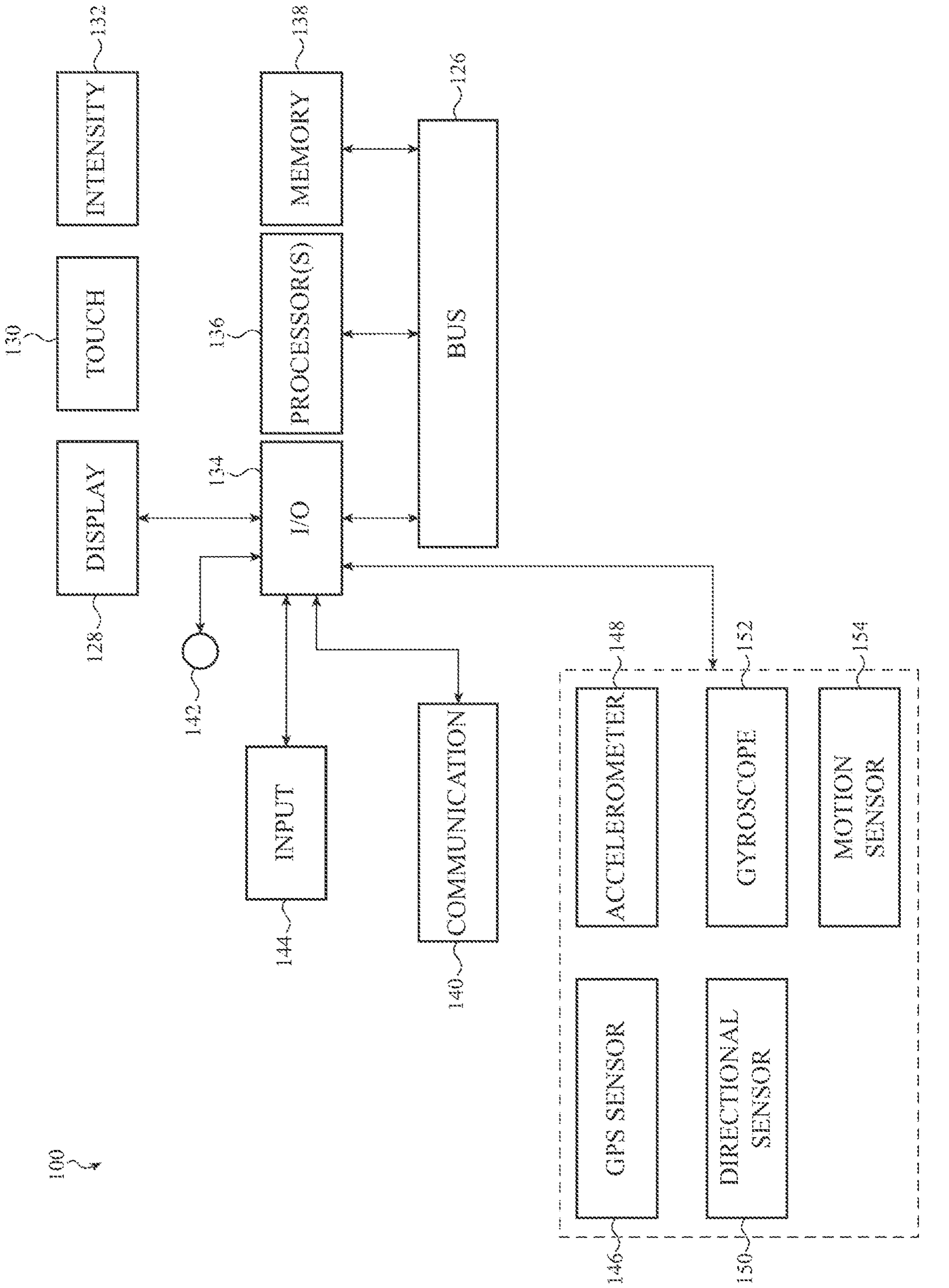
FIG. 1B depicts exemplary components of the device of FIG. 1A, such as described herein.

FIG. 1B depicts exemplary components of the device 100. In some embodiments, device 100 has a bus 126 that operatively couples an I/O section 134 with one or more computer processors 136 and memory 138. The I/O section 134 can be connected to display 128, which can have touch-sensitive component 130 and, optionally, intensity sensor 132 (e.g., contact intensity sensor). In addition, I/O section 134 can be connected with communication unit 140 for receiving application and operating system data, using Wi-Fi, Bluetooth®, near field communication (NFC), cellular, and/or other wireless communication techniques. The device 100 can include input mechanisms 142 and/or 144. Input mechanism 142 is, optionally, a rotatable input device or a depressible and rotatable input device, for example. Input mechanism 142 is, optionally, a button, in some examples. The device 100 optionally includes various sensors, such as GPS sensor 146, accelerometer 148, directional sensor 150 (e.g., compass), gyroscope 152, motion sensor 154, and/or a combination thereof, all of which can be operatively connected to I/O section 134. Some of these sensors, such as accelerometer 148 and gyroscope 152 may assist in determining an orientation of the device 100 or a portion thereof.

Memory 138 of the device 100 can include one or more non-transitory computer-readable storage mediums, for storing computer-executable instructions, which, when executed by one or more computer processors 136, for example, can cause the computer processors to perform the techniques that are described here (such as operating the sensing arrangements as described herein). A computer-readable storage medium can be any medium that can tangibly contain or store computer-executable instructions for use by or in connection with the instruction execution system, apparatus, or device. In some examples, the storage medium is a transitory computer-readable storage medium. In some examples, the storage medium is a non-transitory computer-readable storage medium. The non-transitory computer-readable storage medium can include, but is not limited to, magnetic, optical, and/or semiconductor storages. Examples of such storage include magnetic disks, optical discs based on CD, DVD, or Blu-ray® technologies, as well as persistent solid-state memory such as flash, solid-state drives, and the like.

The computer processor 136 can include, for example, dedicated hardware as defined herein, a computing device as defined herein, a processor, a microprocessor, a programmable logic array (PLA), a programmable array logic (PAL), a generic array logic (GAL), a complex programmable logic device (CPLD), an application-specific integrated circuit (ASIC), a field-programmable gate array (FPGA), or any other programmable logic device (PLD) configurable to execute an operating system and applications of device 100, as well as to facilitate capturing of images as described herein. Device 100 is not limited to the components and configuration of FIG. 1B, but can include other or additional components in multiple configurations.

Figure 2:
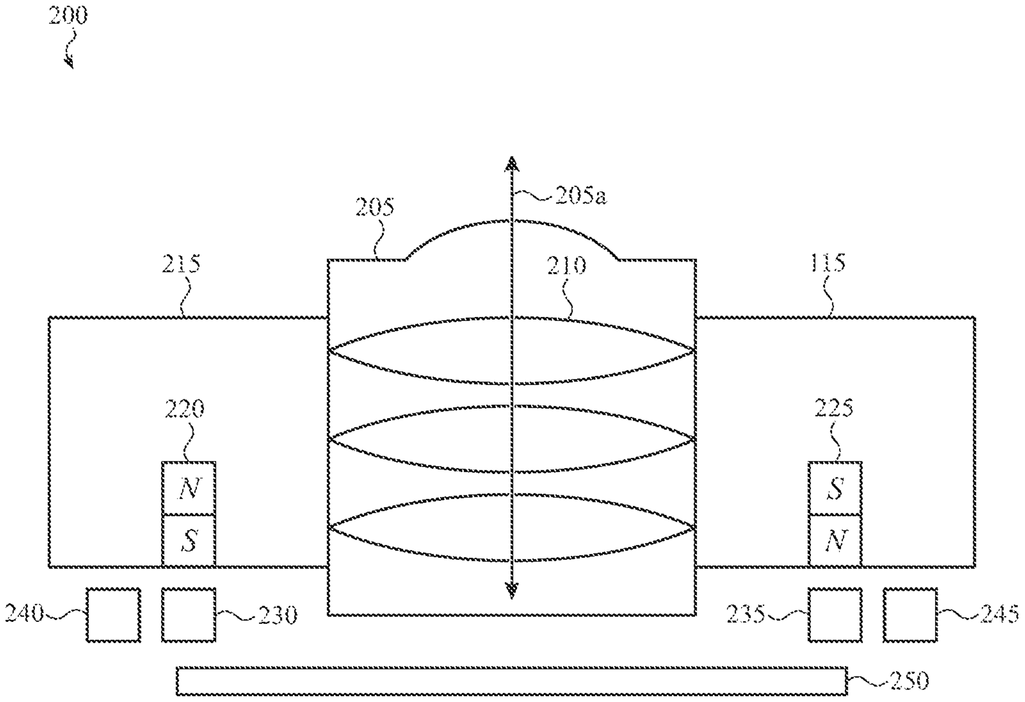
FIG. 2 shows a schematic side view of an example camera module having at least one position sensor and at least one temperature sensor, such as described herein.

FIG. 2 shows a schematic side view of an example camera module 200 according to embodiments described herein. The camera module 200 has a lens module 205 and an image sensor 250 disposed below the lens module 205. The lens module 205 may include a set of optical elements 210 that are configured to receive and transmit light towards the image sensor 250. The camera module 200 may configured such that one or both of the lens module 205 and the image sensor 250 are moveable position within the camera module 200. For example, an autofocus (AF) mechanism may be implemented to generate relative movement between the lens module 205 and the image sensor 250 vertically along the optical axis 205*a*. As another example, an optical image stabilization (OIS) mechanism may be implemented by to generate lateral relative movement between the image sensor 250 and the lens module 205 in one or more directions orthogonal to the optical axis 205*a*. It should be appreciated that the camera module 200 may include a wide range of actuators (e.g., a bearing actuator, a stepped motor, a voice coil motor actuator, a piezoelectric actuator, a leaf spring actuator, combinations thereof, and the like) configured to generate this relative movement, as will readily be understood by someone of ordinary skill in the art.

For example, in the variation shown in FIG. 2 the lens module 205 may moveable relative to the image sensor 250 along the optical axis 205*a*. In these instances, it may be desirable to sense a position of the lens module 205 as it moves within the camera module 200. Accordingly, the camera module 200 may include a set of position sensors (e.g., a first position sensor 230 and a second position sensor 235 positioned on opposite sides of the lens module 205) that are configured to measure and monitor a relative position of the lens module 205. The first and second position sensors 230, 235 may be each be fixed at a corresponding location in the camera module 200, such that each of the position sensors 230, 235 may measure the relative position between the lens module 205 and the corresponding location in the camera module 200.

For example, the lens module 205 may be mounted to a lens carrier 215 that includes a set of magnets (e.g., a first magnet 220 and a second magnet 225 disposed on opposite sides of the lens module 205), such that the lens module 205 is held in a fixed relationship to the lens carrier 215 and the set of magnets. The first position sensor 230 is positioned to measure the magnetic field of the first magnet 220 and the second position sensor 235 is positioned to measure the magnetic field of the second magnet 225. For example, each position sensor may include a Hall sensor, a tunneling magnetoresistance (TMR) sensor, a giant magnetoresistance (GMR) sensor, an anisotropic magnetoresistance (AMR) sensor, or the like.

As the lens carrier 215 (and thereby the lens module 205) moves within the camera module 200, one or more properties of the magnetic field of the first magnet 220 that is measured by the first position sensor 230 may change. Accordingly, a signal generated by the first position sensor 230 may represent the relative position between the first position sensor 230 and the first magnet 220, which in turn may be used to determine the relative position between the first position sensor 230 and the lens module 205. Similarly, a signal generated by the second position sensor 235 may represent the relative position between the second position sensor 235 and the second magnet 225, which in turn may be used to determine the relative position between the second position sensor 235 and the lens module 205.

While the first and second position sensors 230, 235 are shown in FIG. 2 as measuring the position of a moving lens module 205, similar position sensors may be used to measure the relative position/movement between any two components (e.g., between an image sensor and a fixed portion of a camera module, between a lens module and an image sensor, between different lens elements of lens module, or the like) depending on the placement of each position sensor and a corresponding magnet. Similarly, while the first and second magnets 220, 225 are shown in FIG. 2 as being connected to a moving component (e.g., the lens carrier 215) and the first and second position sensors 230, 235 are shown as being fixed relative to the camera module 200, this arrangement be reversed such that first and/or second position sensors 230, 235 are instead connected to the moving component.

Additionally, it may be desirable to measure a temperature at one or more locations within the camera module 200. Accordingly, the camera module may include a set of temperature sensors (e.g., a first temperature sensor 240 and a second temperature sensor 245). Each temperature sensor may generate a signal that varies as a function of temperature measured by the temperature sensor. For example, in some embodiments, each of the first and second temperature sensors 240, 245 may include a negative temperature coefficient (NTC) resistor, a positive temperature coefficient (PTC) resistor, or another temperature-sensitive resistor, such that a resistance within the temperature sensor changes with temperature. Examples of temperature sensors are described herein with respect to FIGS. 4-7. The camera module 200 may use the signals generated by the first and second temperature sensors 240, 245 to adjust operational parameters of the camera module 200.

Figure 3:
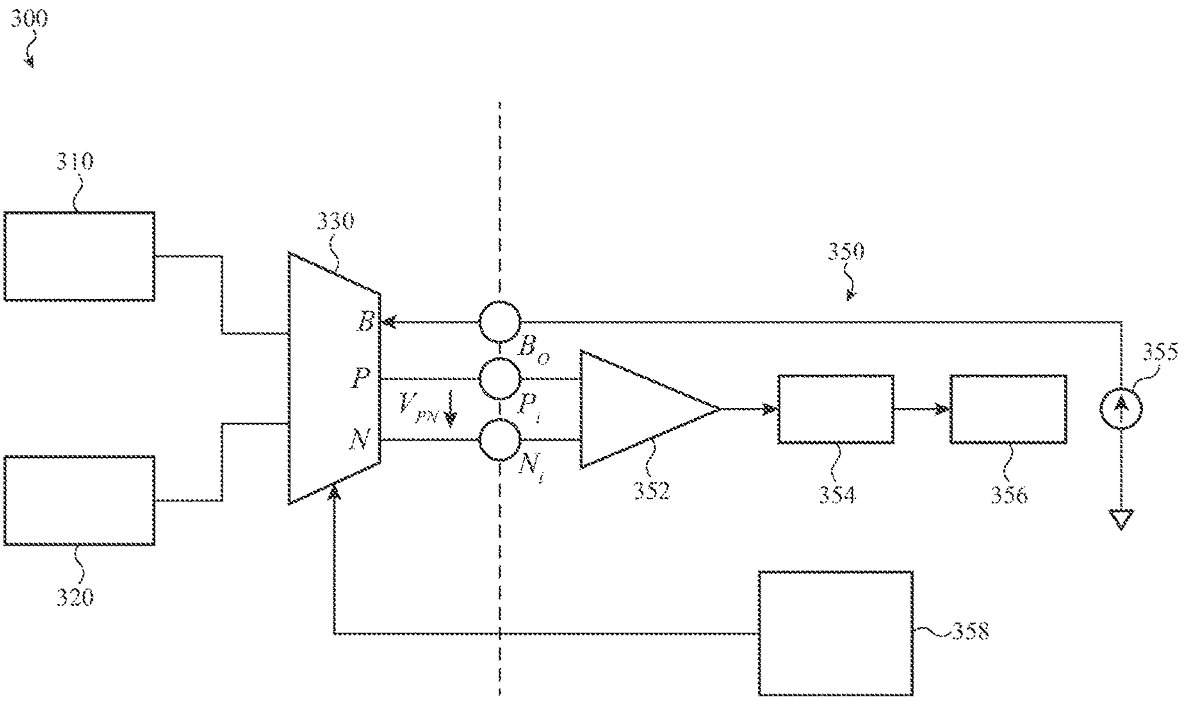
FIG. 3 shows a schematic view of an example sensing arrangement for a camera module having at least one position sensor and at least one temperature sensor, such as described herein.

When a sensing arrangement of a camera module includes multiple sensors, such as discussed herein, a driver may be configured to selectively measure signals from multiple sensors using a common set of inputs. FIG. 3 shows a schematic view of an example sensing arrangement 300 for a camera module (e.g., the camera module 200 in FIG. 2), according to embodiments described herein. As shown in the example non-limiting embodiment of FIG. 3, the sensing arrangement 300 includes a first sensor 310 and a second sensor 320 that are communicably connected to a driver chip 350 via a multiplexer 330. Specifically, the multiplexer 330 is connected to a set of terminals of the driver chip 350, and may controllably electrically connect the first sensor 310 or the second sensor 320 (or in some instances, an additional sensor connected to the multiplexer 330) to the set of terminals.

While the driver chips described herein as discussed as being used to measure signals from one or more sensors, it should be appreciated that any of these driver chips may have additional functionality. For example, the driver chip may be configured to control an AF mechanism and/or an OIS mechanism of the camera module. To operate these mechanisms, the driver chip may output current to power one or more actuators, and thereby move one or more components within the camera module. In some instances, the driver chip may use signals from one or more sensors (e.g., the first sensor 310 and/or the second sensor 320) in controlling an AF mechanism or an OIS mechanism of a camera module.

In the variation shown in FIG. 3, the set of terminals includes a pair of input terminals (e.g., a first input terminal "$P_i$" and a second input terminal "$N_i$") and a first output terminal "$B_o$". Although not shown in FIG. 3, the set of terminals may further include a ground terminal configured to provide a common ground to the driver chip 350 and the first and second sensors 310, 320. Within the driver chip 350, the first output terminal $B_o$ may be connected to a bias current source 355, which allows the driver chip 350 to provide power (e.g., a bias current) to the first and second sensor 310, 320 via the multiplexer 330. For example, the first output terminal $B_o$ may be connected to a corresponding terminal "B" on the multiplexer 330, which allow the multiplexer 330 to selectively electrically connect the first output terminal $B_o$ to the first sensor 310 or the second sensor 320. While the bias current source 355 is shown in FIG. 3 as part of the driver chip 350, it should be appreciated that in other instances the bias current source 355 may be incorporated into the sensing arrangement 300 as part of a different chip or circuit.

The input terminals Pi, Ni of the driver chip 350 are connected to corresponding terminals P, N of the multiplexer, which allows the multiplexer 330 to selectively electrically connect the first sensor 310 or the second sensor 320 to the input terminals Pi, Ni of the driver chip 350. Within the driver chip 350, the pair of input terminals $P_i$, $N_i$ may be connected to sensing circuitry that includes analog front end (AFE) circuitry 352. The AFE circuitry 352 is configured to output an analog signal that depends on a voltage signal $V_{PN}$ applied across the input terminals $P_i$, $N_i$.

For example, the AFE circuitry 352 may condition and/or amplify the voltage signal $V_{PN}$. The sensing circuitry may include an analog-to-digital converter (ADC) 354 that converts the output of the AFE circuitry 352 to a digital signal, and may further include a processor 356 that receives and analyzes the digital signal to determine a position or temperature depending on which sensor is currently providing a voltage signal via the input terminals $P_i$, $N_i$.

For example, in some instance the first sensor 310 is a position sensor and the second sensor 320 is a temperature sensor. Accordingly, at certain points in time the multiplexer 330 will electrically connect the first sensor 310 to the set of terminals. When the first sensor 310 is electrically connected to the set of terminals, the first sensor 310 may receive power from the first output terminal $B_o$ and the input terminals $P_i$, $N_i$ receive a first voltage signal from the first sensor 310. Accordingly, the sensing circuitry may measure the first voltage signal and analyze the first voltage signal (e.g., using the processor 356) to determine a position associated with the first sensor 310. At other points in time, the multiplexer 330 will electrically connect the second sensor 320 to the set of terminals. When the second sensor 320 is electrically connected to the set of terminals, the second sensor 320 may receive power from the first output terminal $B_o$ and the input terminals $P_i$, $N_i$ receive a second voltage signal from the second sensor 320. Accordingly, the sensing circuitry may measure the second voltage signal and analyze the second voltage signal (e.g., using the processor 356) to determine a temperature associated with the second sensor 320.

The driver chip 350 may also include a selection logic module 358 that controls which sensor (e.g., the first sensor 310, the second sensor 320, or any additional sensor that is connected to the multiplexer 330) will be connected to the set of terminals at any given point in time. Specifically, the selection logic module 358 executes a selection logic to select a sensor (e.g., the first sensor 310 or the second sensor 320), and outputs a control signal to the to the multiplexer 330 indicating the selected sensor. The multiplexer 330, upon receiving the control signal, will electrically connect the selected sensor to the set of terminals of the driver chip 350. For example, the selection logic module 358 may provide a first control signal to the multiplexer indicating a selection of the first sensor 310, or may provide a second control signal to the multiplexer indicating a selection of the second sensor 320.

Figure 4:
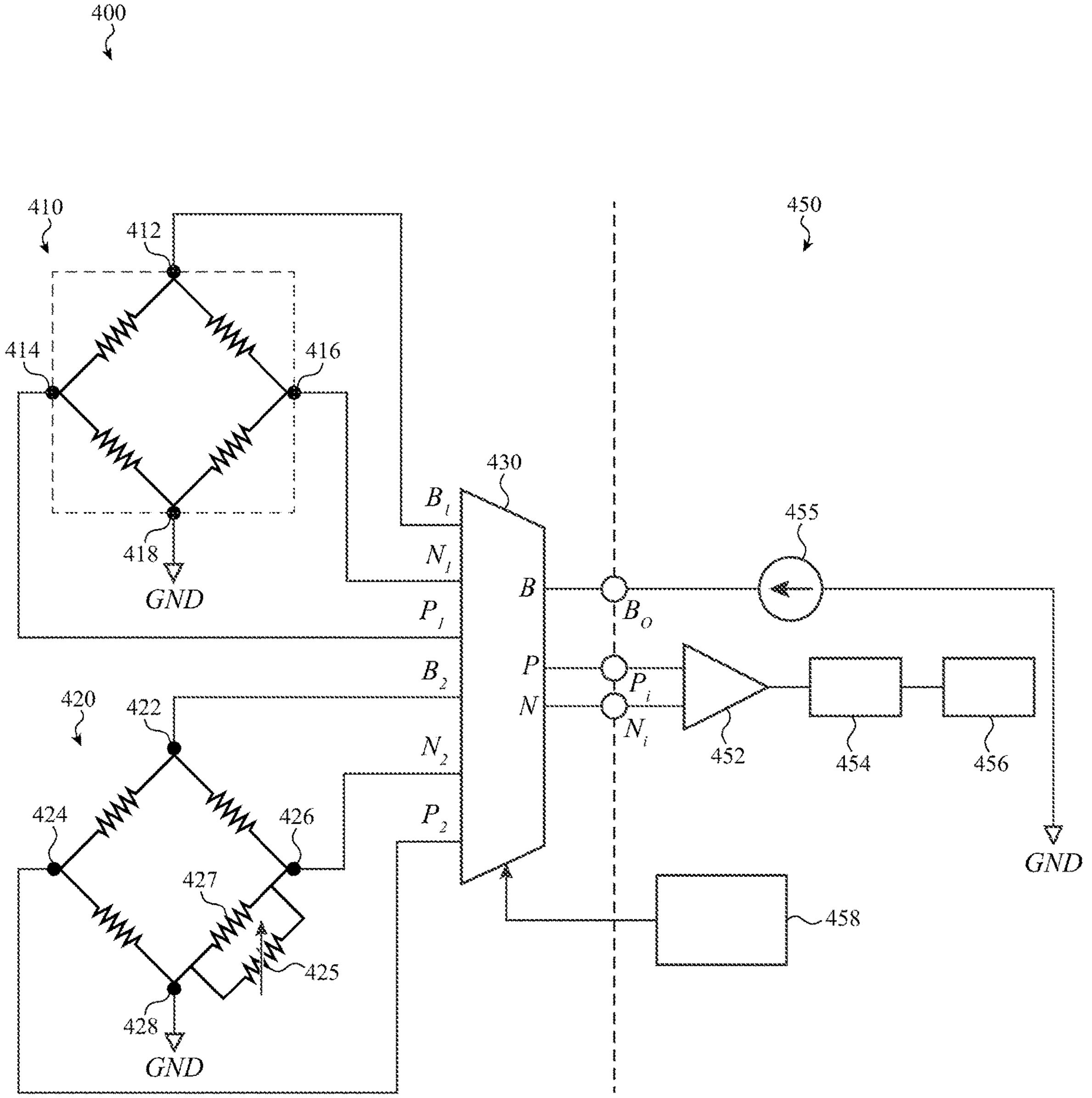
FIG. 4 shows a schematic view of a sensing arrangement for a camera module having a position sensor and a temperature sensor that receive a bias current from a single bias current source, such as described herein.

FIG. 4 shows a schematic view of an example of a sensing arrangement 400 that FIG. 4 having a position sensor 410 and a temperature sensor 420 that are communicably coupled to a driver chip 450 via a multiplexer 430. In this way, a set of terminals of the driver chip 450 may be selectively electrically connected to the position sensor 410 or the temperature sensor 420 (or, in some instances, one or more additional sensors), such as described above with respect to FIG. 3. The set of terminals may include a pair of input terminals $P_i$, $N_i$ connecting the multiplexer 430 (via terminals P, N of the multiplexer 430) to sensing circuitry (e.g., including analog front end circuitry 452, ADC 459, and processor 456, such as described with respect with FIG. 3) and a first output terminal $B_o$ that connects the multiplexer 430 (via terminal B of the multiplexer 430) to a bias current source 455. The driver chip 450 may further include a selection logic module 458 that is configured to control which sensor is currently electrically connected to the set of terminals via the multiplexer 430.

The position sensor 410 is configured to, in response to receiving a bias current, output a first voltage signal that depends on a position being measured by the position sensor 410. The position sensor 410 may be any suitable position sensor (e.g., a Hall sensor, a TMR sensor, a GMR sensor, an AMR sensor, or the like), and may be represented by an equivalent circuit that forms a Wheatstone bridge. Specifically, the position sensor 410 has a bias input terminal 412, a set of measurement terminals 414, 416, and a ground terminal 418 (which may be connected to a common ground with the driver chip 450). When the position sensor 410 is positioned within a magnetic field of a magnet (not shown) and receives a bias current at the bias input terminal 412, the first voltage signal may vary with changes to the magnetic field (e.g., due to relative movement between the magnet and the position sensor 410).

The temperature sensor 420 is configured to, in response to receiving a bias current, output a second voltage signal that depends on a temperature being measured by the temperature sensor 420. Specifically, the temperature sensor 420 has a bias input terminal 422, a set of measurement terminals 424, 426, and a ground terminal 428 (which may be connected to a common ground with the driver chip 450). In the variation shown in FIG. 4, the temperature sensor 420 is configured as a Wheatstone bridge circuit, in which a temperature-sensitive resistor 425 is positioned in one of the legs of the Wheatstone bridge (e.g. between the first measurement terminal 426 and the ground terminal 428). The second voltage signal will change with the resistance of the temperature-sensitive resistor 425, which is dependent on the temperature of the temperature-sensitive resistor 425. Accordingly, the second voltage signal will vary with temperature and may be used to measure the local temperature at the temperature-sensitive resistor 425. In some instances, the temperature-sensitive resistor 425 may be connected in parallel with a second, non-temperature-sensitive resistor 427 in a leg of the Wheatstone bridge circuit. In these instances, these resistors 425, 427 may be selected to help control the range of values of the second voltage signal that will be outputted by the temperature sensor 420 during operation.

The driver chip 450 is switchably electrically connected to the position sensor 410 or the temperature sensor 420 through the multiplexer 430, which may control whether the position sensor 410 or the temperature sensor 420 is electrically connected to the driver chip 450 at any given time. For example, the bias input terminal 412 and the set of measurement terminals 414, 416 of the position sensor 410 are be connected to a first corresponding set of terminals of the multiplexer 430 (e.g., terminals $B_1$, $P_1$, and $N_1$, respectively). When the multiplexer 430 electrically connects the position sensor 410 to the driver chip 450, the multiplexer 430 will electrically connect the bias input terminal 412 to the first bias output terminal $B_o$ of the driver chip 450, and will electrically connect the set of measurement terminals 414, 416 to the input terminals $P_i$, $N_i$ of the driver chip 450. In other words, the multiplexer 430 receives the first voltage signal from the measurement terminals 414, 416 of the position sensor 410 through the terminals $P_1$, $N_1$, and transmits the voltage signals to the driver chip 450 through the terminals P, N. This allows the driver chip 450 to measure the first voltage signal.

Similarly, the bias input terminal 422 and the set of measurement terminals 424, 426 of the temperature sensor 420 are connected to a second corresponding set of terminals of the multiplexer 430 (e.g., terminals $B_2$, $P_2$, and $N_2$, respectively). When the multiplexer 430 electrically connects the temperature sensor 420 to the driver chip 450, the multiplexer 430 will electrically connect the bias input terminal 422 to the first bias output terminal $B_o$ of the driver chip 450, and will electrically the set of measurement terminals 424, 426 to the input terminals $P_i$, $N_i$ of the driver chip 450. In other words, the multiplexer 430 receives the second voltage signal from the measurement terminals 424, 426 of the temperature sensor 420 through the terminals $P_2$, $N_2$, and transmits the voltage signals to the driver chip 450 through the terminals P, N. This allows the driver chip 450 to measure the second voltage signal.

In some variations, the driver chip 450 may be configured to change the bias current provided by the bias current source 455 during operation. For example, it may be desirable to maintain the voltage signal measured by the input terminals $P_i$, $N_i$ of the driver chip 450 within a particular range of voltages. Depending on the configuration of the position sensor 410 and/or the temperature sensor 420 (as well as the bias current supplied by the bias current source 455), it may be possible for the voltage signals generated by one of these sensors to fall outside of this range. Accordingly, in some variations the bias current source 455 may be controllable (e.g., by the processor 456, the selection logic module 458, and/or other logic in the driver chip 450) to change the bias current provided by the bias current source 455.

In one non-limiting example, the bias current source 455 may be controlled to change the bias current as the multiplexer 430 switches between the position sensor 410 and the temperature sensor 420. For example, the bias current source 455 may provide a first bias current (or a first range of bias currents) when the position sensor 410 is electrically connected to the driver chip 450, and may provide a second bias current (or a second range of bias currents) when the temperature sensor 420 is electrically connected to the driver chip 450.

In another non-limiting example, the bias current source 455 may be controlled to change the bias current while a given sensor (e.g., the temperature sensor 420) is electrically connected to the driver chip 450. For example, due to the range of temperatures measured by the temperature sensor 420, the second voltage signal may vary across a wider range of voltages for a given bias current as compared to the first voltage signal generated by the position sensor 410. In these instances, it may be desirable to adjust the bias current provided by the bias current source 455 as the temperature measured by the temperature sensor 420 changes. Because the magnitude of the second voltage signal may depend on the magnitude of the bias current, the bias current source 455 may be adjusted to keep the second voltage signal within a predetermined range.

Figure 5:
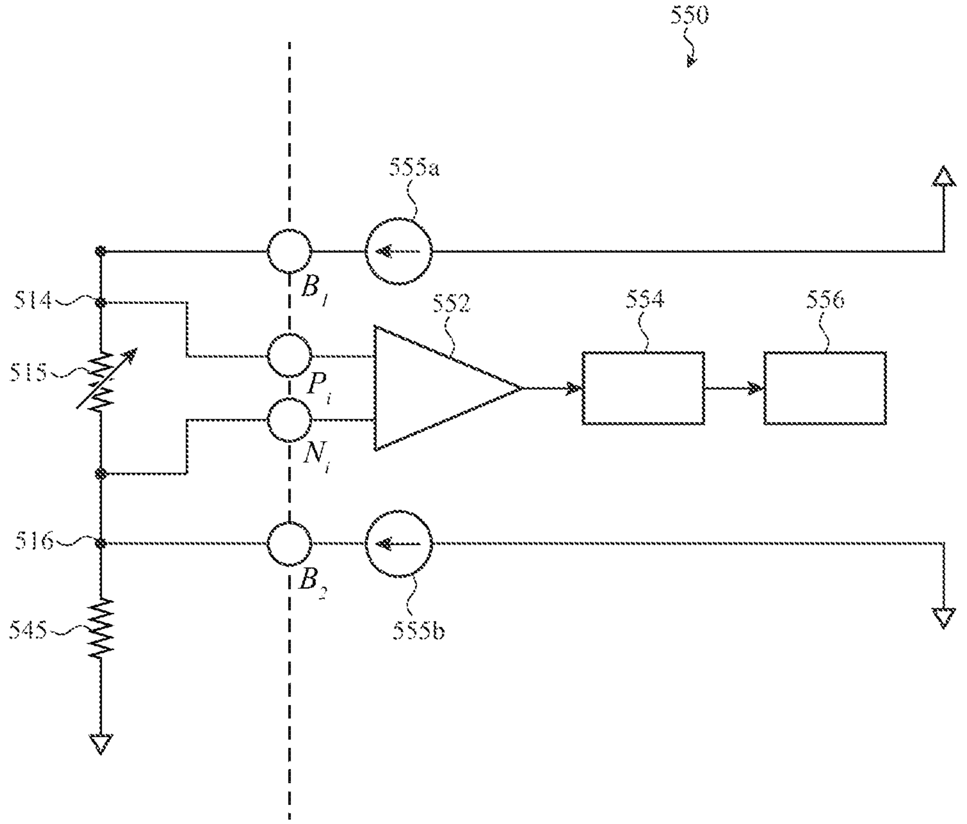
FIG. 5 shows a schematic view of a sensing arrangement for a camera module having a temperature sensor that receives a bias current from two bias current sources, such as described herein.

FIG. 5 shows a schematic view of a sensing arrangement 500 having a temperature sensor 510 that is configured receives two bias currents from a driver chip 550. Specifically, the driver chip 550 may include a first bias current source **555*a* and a second bias current source 555*b* positioned in the driver chip 550. In some instances, the bias current provided by one of the bias current sources may be adjusted during operation to maintain a voltage signal generated by the temperature sensor 510 within a predetermined range, such as described in more detail above. This may allow the driver chip 550 to measure, for a given dynamic range of the driver chip 550, a wider range of temperatures. As shown there, the driver chip 550 has a first bias output terminal B1 that is connected to the first bias current source 555*a* and the second bias output terminal B2 that is connected to a second bias current source 555*b*. The driver chip 650 includes a set of input terminals Pi, Ni for receiving a voltage signal from the temperature sensor 510. The driver chip 550 further includes an AFE circuit 552, an ADC 554, and a processor 556 that may be configured in any manner as described with respect to the AFE circuit 352, the ADC 354, and the processor 356 of FIG. 3**.

The temperature sensor 510 includes a temperature-sensitive resistor 515 (e.g., an NTC resistor) connected between a set of measurement terminals (e.g., a first measurement terminal 514 and a second measurement terminal 516). The second measurement terminal 516 is connected to ground through a second resistor 545. To measure a temperature using the temperature sensor 510, the first measurement terminal 514 is electrically connected to both the first bias output terminal $B_1$ and a first input terminal $P_i$, and the second measurement terminal 516 is electrically connected to both the second bias output terminal $B_2$ and a second input terminal $N_i$. As a result, a voltage signal measured by the input terminals $P_i$, $N_i$ of the driver chip 550 will vary as the resistance of the temperature-sensitive resistor 515 changes, and thus will vary as the measured temperature changes.

In some embodiments, the driver chip 550 uses the voltage signal received at the set of inputs $P_i$, $N_i$ from the temperature sensor 510 as feedback to further adjust the bias current provided by one or both of the bias current sources **555*a*, 555*b*. Because the measured voltage signal also depends on the first and second bias currents, changing the first or the second bias current will change the measured voltage signal for a given resistance of the temperature-sensitive resistor 515. Accordingly, the current provided by a bias current source (e.g., the first bias current source 555*a* or the second bias current source 555*b*) may be adjusted to maintain the measured voltage signal within a predetermined range. For example, if the measured voltage signal falls to a first threshold, one of the bias currents may be changed to increase the measured voltage signal. Conversely, if the measured voltage signal increases to a second threshold, one of the bias currents may be changed to decrease the measured voltage signal. In these instances, the processor 556** may use information about the selected bias currents when determining a temperature from the measured voltage signal.

Figure 6:
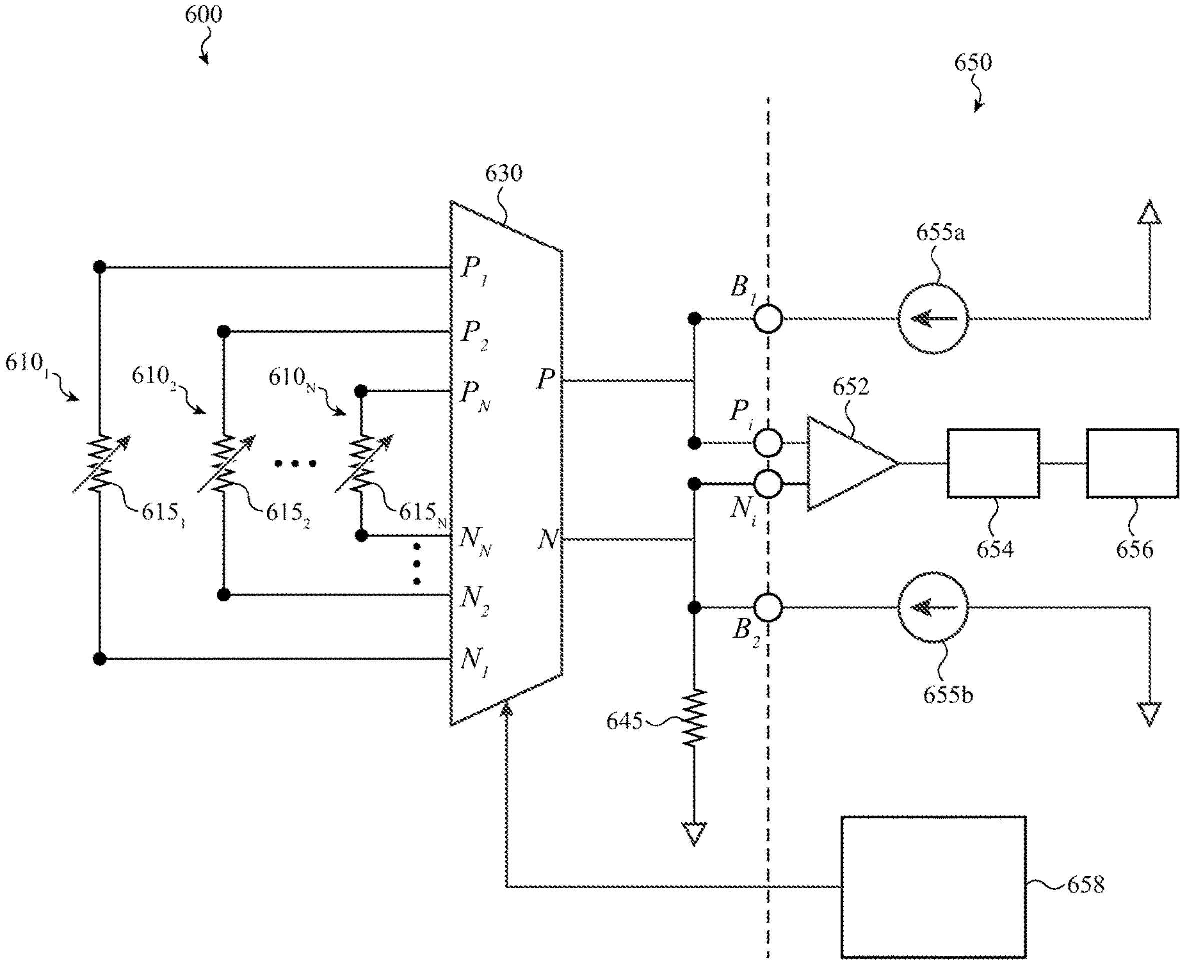
FIG. 6 shows a schematic view of a sensing arrangement for a camera module having a plurality of temperature sensors that receive a bias current from two bias current sources, such as described herein.

In some variations, multiple versions of the temperature sensor 510 of FIG. 5 may be measured by the same set of inputs of a driver chip. For example, FIG. 6 shows a schematic view of a sensing arrangement 600 having a plurality of temperature sensors $610_1$-$610_N$, each of which is communicably coupled to a driver chip 650 via a multiplexer 630. As shown there, the driver chip 650 has a first bias output terminal B1 that is connected to the first bias current source **655*a* and a second bias output terminal B2 that is connected to a second bias current source 655*b*. The driver chip 650 includes a set of input terminals Pi, Ni for receiving a voltage signal from a selected temperature sensor of the plurality of temperature sensors $610_1$-$610_N$. The driver chip 650 further includes an AFE circuit 652, an ADC 654, a processor 656, and a selection logic module 658 that may be configured in any manner as described with respect to the AFE circuit 352, the ADC 354, the processor 356, and the selection logic module 358 of FIG. 3**.

Each of the temperature sensors $610_1$-$610_N$ includes a respective temperature-sensitive resistor (collectively forming a plurality of temperature-sensitive resistors $615_1$-$615_N$) that is connected to the multiplexer 630 via a corresponding pair of temperature-sensing terminals. Specifically, the corresponding temperature-sensing terminals of each of these temperature-sensitive resistors $615_1$-$615_N$ is electrically connected to a corresponding pair of inputs on the multiplexer 630. For example, a first temperature-sensitive resistor $615_1$ of the first temperature sensor $610_1$ is electrically connected between a first pair of terminals $P_1$, $N_1$ of the multiplexer 630, a second temperature-sensitive resistor $615_2$ of the second temperature sensor $610_2$ is electrically connected between a second pair of terminals $P_2$, $N_2$ of the multiplexer 630, and an Nth temperature-sensitive resistor $615_N$ of the Nth temperature sensor $610_N$ is electrically connected between an Nth pair of terminals $P_N$, $N_N$ of the multiplexer. Accordingly, the multiplexer 630 may selectively electrically couple (e.g., based on a control signal from selection logic module 658 selecting one of the plurality of temperature sensors $610_1$-$610_N$) the temperature-sensitive resistor of the selected temperature sensor to the driver chip 650 via a set of terminals P, N of the multiplexer 630

Specifically, a first terminal P of the multiplexer 630 is electrically connected to both the first bias output terminal $B_1$ and the first input terminal $P_i$ of the driver chip 650, and a second terminal N of the multiplexer 630 is electrically connected to both the second bias output terminal $B_2$ and the second input terminal $N_i$ of the driver chip 650. The first terminal P of the multiplexer 630, and thereby the second bias output terminal $B_2$ and the second input terminal $N_i$ of the driver chip 650, is grounded through a resistor 645. The multiplexer 630 may be controlled to switchably and selectively electrically connect the temperature-sensing terminals of the temperature-sensitive resistor of a selected temperature sensor to the input terminals $N_i$, $P_i$ of the driver chip 650. In this way, the input terminals $P_i$, $N_i$ of the driver chip 650 may measure the voltage across the temperature-sensitive resistor, which may vary as a function of the temperature associated with that temperature-sensitive resistor. Accordingly, the driver chip 650 may, at any given time, measure a voltage signal that represents a temperature of a selected one of the plurality of temperature sensors $610_1$-$610_N$.

By switching between different temperature sensors, the sensing arrangement 600 may measure temperatures at different locations within a camera module. Additionally, while measuring temperature with a given temperature sensor, the driver chip 650 may adjust the bias current provided by the first bias current source 655*a* and/or the second bias current source 655*b*, such as described in more detail above.

Figure 7:
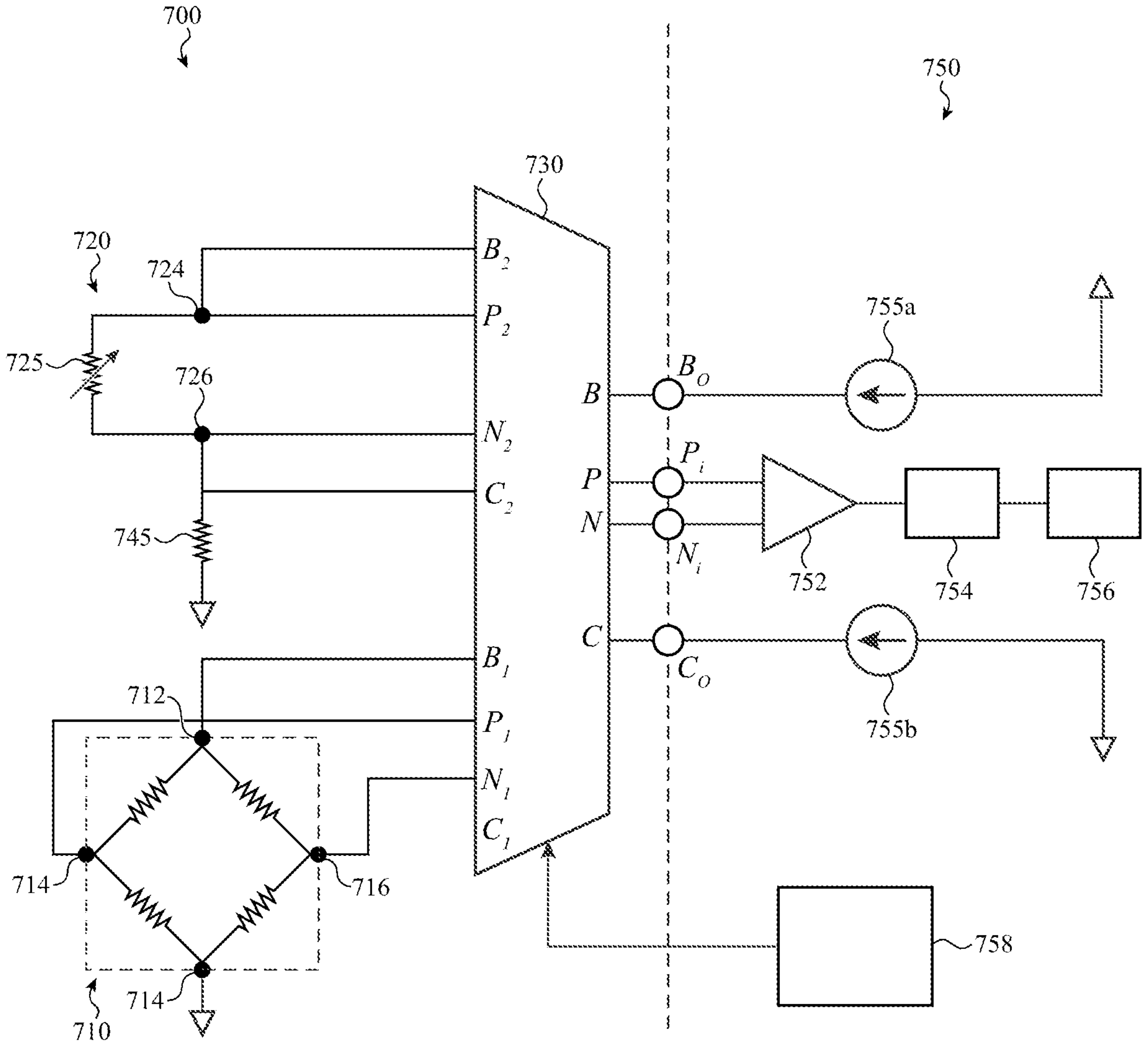
FIG. 7 shows a schematic view of a sensing arrangement for a camera module having a temperature sensor that receive bias currents from two bias current sources and a position sensor, such as described herein.

FIG. 7 shows a schematic view of a sensing arrangement 700 having a position sensor 710 and a temperature sensor 720, where the temperature sensor 720 is configured to receive two bias currents from a driver chip 750. Specifically, the temperature sensor 720 may be configured to operate in a manner as described above with respect to the temperature sensor 510 of FIG. 5. The temperature sensor 720 and the position sensor 710 are communicably coupled to the driver chip 750 via a multiplexer 730.

As shown in FIG. 7, the driver chip 750 has a first bias output terminal $B_o$ that is connected to the first bias current source 755*a* and a second bias output terminal $C_o$ that is connected to a second bias current source 755*b*. The driver chip 750 includes a set of input terminals Pi, Ni for receiving a voltage signal selectively from the position sensor 710 or the temperature sensor 720. The driver chip 750 further includes an AFE circuit 752, an ADC 754, a processor 756, and a selection logic module 758 that may be configured in any manner as described with respect to the AFE circuit 352, the ADC 354, the processor 356, and the selection logic module 358 of FIG. 3.

The position sensor 710 is configured to, in response to receiving a bias current, output a first voltage signal that depends on a position being measured by the position sensor 410. The position sensor 710 may be any suitable position sensor (e.g., a Hall sensor, a TMR sensor, a GMR sensor, an AMR sensor, or the like), and may be represented by an equivalent circuit that forms a Wheatstone bridge. Specifically, the position sensor 710 has a bias input terminal 712, a set of measurement terminals 714, 716, and a ground terminal 718 (which may be connected to a common ground with the driver chip 450). When the position sensor 710 is positioned within a magnetic field of a magnet (not shown) and receives a bias current at the bias input terminal 712, the first voltage signal may vary with changes to the magnetic field (e.g., due to relative movement between the magnet and the position sensor 710).

The bias input terminal 712 and the set of measurement terminals 714, 716 of the position sensor 710 are be connected to a first corresponding set of terminals of the multiplexer 430 (e.g., terminals B, $P_1$, and $N_1$, respectively). When the multiplexer 730 electrically connects the position sensor 710 to the driver chip 750, the multiplexer 730 will electrically connect the bias input terminal 712 to the first bias output terminal $B_o$ of the driver chip 750 (e.g., via terminal B of the multiplexer 730), and will electrically connect the set of measurement terminals 714, 716 to the input terminals $P_i$, $N_i$ of the driver chip 750 (e.g., via terminals P, N of the multiplexer 730). In other words, the multiplexer 730 receives the first voltage signal from the measurement terminals 714, 716 of the position sensor 410 through the terminals $P_1$, $N_1$, and transmits the voltage signals to the driver chip 750 through the terminals P, N. This allows the driver chip 750 to measure the first voltage signal. When the position sensor 710 is electrically connected to the driver chip 750, the multiplexer 730 may not actively connect the second bias output Co to any sensor (e.g., the multiplexer 730 may route the connection to a dummy terminal C1 of the multiplexer 730).

The temperature sensor 720 is configured to, in response to receiving a first and a second bias current, output a second voltage signal that depends on a temperature being measured by the temperature sensor 720. The temperature sensor 720 includes a temperature-sensitive resistor 715 (e.g., an NTC resistor) connected between a set of measurement terminals (e.g., a first measurement terminal 724 and a second measurement terminal 726. The second measurement terminal 726 is connected to ground through a second resistor 745.

The first measurement terminal 724 of the temperature sensor 720 may be connected in parallel to two terminals of the multiplexer (e.g., terminals B2 and P2). When the temperature sensor 720 is selected (e.g., based on a control signal from the selection logic module 758), the multiplexer 730 will electrically connect the first measurement terminal 724 to both the first bias output terminal $B_o$ and the first input terminal $P_i$ of the driver chip 750 (e.g., via terminals B2, P2, B and P of the multiplexer 730). Similarly, the second measurement terminal 726 of the temperature sensor 720 may be connected in parallel to two terminals of the multiplexer (e.g., terminals C2 and N2). When the temperature sensor 720 is selected, the multiplexer 730 will electrically connect the second measurement terminal 726 to both the second bias output terminal $C_o$ and the second input terminal $P_i$ of the driver chip 750 (e.g., via terminals C2, N2, C and N of the multiplexer 730). Accordingly, the input terminals $N_i$, $P_i$ of the driver chip 750 will measure a second voltage signal that represents the voltage across the temperature-sensitive resistor 715, which may vary as the measured temperature change the resistance of the temperature-sensitive resistor 715.

While measuring the temperature sensor 720, the driver chip 750 may adjust the bias current provided by the first bias current source 755*a* and/or the second bias current source 755*b*, such as described in more detail above. In some variations, the first bias current source 755*a* may be fixed, such that it provides the same bias current to the position sensor 710 when measuring a position as it does to the temperature sensor 720 when measuring a temperature. In some of these instances, the second bias current source 755*b* may be controllable to adjust the magnitude of the second voltage signal.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description, and not limitation. They are not targeted to be exhaustive or to limit the embodiments to the precise forms disclosed. It will be apparent to one of ordinary skill in the art, after reading this description, that many modifications and variations are possible in view of the above teachings or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A sensing arrangement for a camera module comprising:

a position sensor having a first bias input and a first set of terminals;

a temperature sensor having a temperature-sensitive resistor, a second bias input, and a second set of terminals;

a driver chip communicably connected to the position sensor and the temperature sensor, the driver chip having a bias output connected to a bias current source and a set of inputs for receiving a voltage signal; and a multiplexer configured to selectively connect the position sensor or the temperature sensor to the driver chip, wherein:

in response to the driver chip applying a first control signal to the multiplexer indicating a selection of the position sensor, the bias output is connected to the first bias input, and the set of inputs is connected to the first set of terminals, such that the voltage signal received by the set of inputs is indicative of a position measured by the position sensor; and in response to the driver chip applying a second control signal to the multiplexer indicating a selection of the temperature sensor, the bias output is connected to the second bias input, and the set of inputs is connected to the second set of terminals, such that the voltage signal received by the set of inputs is indicative of a temperature measured by the temperature sensor.

2. The sensing arrangement of claim 1, wherein the temperature-sensitive resistor is a negative temperature coefficient resistor.

3. The sensing arrangement of claim 1, wherein the position sensor is one of: a Hall sensor, a tunneling magnetoresistance (TMR) sensor, a giant magnetoresistance (GMR) sensor, or an anisotropic magnetoresistance (AMR) sensor.

4. The sensing arrangement of claim 1, wherein:

the position sensor is positioned in a magnetic field of a magnet disposed within the camera module; and the position measured by the position sensor is a relative position between the position sensor and the magnet.

5. The sensing arrangement of claim 1, wherein the temperature sensor comprises a Wheatstone bridge circuit.

6. The sensing arrangement of claim 1, wherein the driver chip executes a selection logic to select whether to send the first control signal or the second control signal to the multiplexer.

7. The sensing arrangement of claim 1, wherein the bias current source is controllable to adjust a bias current supplied by the bias current source.

8. A sensing arrangement for a camera module comprising:

one or more temperature sensors, each temperature sensor having a respective temperature-sensitive resistor, a first temperature-sensing terminal, and a second temperature-sensing terminal;

a driver chip communicably connected to each of the one or more temperature sensors, the driver chip having a first bias output connected to a first bias current source, a second bias output connected a second bias current source, and a set of inputs for receiving a voltage signal; and a multiplexer configured to selectively connect a selected temperature sensor of the one or more temperature sensors to the driver chip, wherein:

in response to the driver chip applying a control signal to the multiplexer indicating the selected temperature sensor, the first bias output and a first input of the set of inputs are connected to the first temperature-sensing terminal of the selected temperature sensor, and the second bias output and a second input of the set of inputs are connected to the second temperature-sensing terminal of the selected temperature sensor, such that the voltage signal received by the set of inputs is indicative of a temperature measured by the selected temperature sensor.

9. The sensing arrangement of claim 8, wherein the one or more temperature sensors comprises a plurality of temperature sensors.

10. The sensing arrangement of claim 8, wherein the selected temperature sensor is connected to ground through a resistor connected in series with the second bias output.

11. The sensing arrangement of claim 8, wherein the temperature-sensitive resistor of at least one of the one or more temperature sensors is a negative temperature coefficient resistor.

12. The sensing arrangement of claim 8, wherein the driver chip executes a selection logic to select a particular temperature sensor and send a control signal to the multiplexer to connect the first bias output and the first input to a first terminal of the particular temperature sensor and the second bias output and the second input to a second terminal of the particular temperature sensor.

13. The sensing arrangement of claim 8, wherein the driver chip selectively adjusts a current provided by the first bias current source or the second bias current source, based on the voltage signal received by the set of inputs.

14. A sensing arrangement for a camera module comprising:

a position sensor having a first set of terminals and a first bias input;

a temperature sensor having a second set of terminals, a second bias input, and a third bias input;

a driver chip communicably connected to the position sensor and the temperature sensor, the driver chip having a first bias output connected to a first bias current source, a second bias output from a second bias current source, and a set of inputs for receiving a voltage signal; and a multiplexer configured to selectively connect the position sensor or the temperature sensor to the driver chip, wherein:

in response to the driver chip applying a first control signal to the multiplexer indicating a selection of the position sensor, the first bias output or the second bias output is connected to the first bias input, and the set of inputs are connected to the first set of terminals, such that the voltage signal received by the set of inputs is indicative of a position measured by the position sensor; and in response to the driver chip applying a second control signal to the multiplexer indicating a selection of the temperature sensor, the first bias output is connected to the second bias input, the second bias output is connected to the third bias input, and the set of inputs are connected to the second set of terminals, such that the voltage signal received by the set of inputs is indicative of a temperature measured by the temperature sensor.

15. The sensing arrangement of claim 14, wherein the temperature sensor further comprises a temperature-sensitive resistor connected between the second set of terminals.

16. The sensing arrangement of claim 14, wherein the second bias input is connected to a first terminal of the second set of terminals, and the third bias input is connected to a second terminal of the second set of terminals.

17. The sensing arrangement of claim 16, wherein the temperature sensor is connected to ground through a resistor connected in series with the second terminal of the second set of terminals.

18. The sensing arrangement of claim 14, wherein the driver chip executes a selection logic to select whether to send the first control signal or the second control signal to the multiplexer.

19. The sensing arrangement of claim 14, wherein the position sensor is positioned in a magnetic field of a magnet disposed within the camera module, the position measured by the position sensor is a relative position between the position sensor and the magnet.

20. The sensing arrangement of claim 14, wherein the driver chip selectively adjusts a current provided by the first bias current source or the second bias current source, based on the voltage signal received by the set of inputs.

* * * * *